United States Patent
Kim

(10) Patent No.: US 12,446,360 B2
(45) Date of Patent: Oct. 14, 2025

(54) LIGHT EMITTING DEVICE AND VEHICLE LAMP INCLUDING THE SAME

(71) Applicant: DONG-EUI UNIVERSITY INDUSTRY-ACADEMIC COOPERATION FOUNDATION, Busan (KR)

(72) Inventor: Sung Hoon Kim, Seoul (KR)

(73) Assignee: DONG-EUI UNIVERSITY INDUSTRY-ACADEMIC COOPERATION FOUNDATION, Busan (KR)

( * ) Notice: Subject to any disclaimer, the term of this patent is extended or adjusted under 35 U.S.C. 154(b) by 52 days.

(21) Appl. No.: 18/409,072

(22) Filed: Jan. 10, 2024

(65) Prior Publication Data
US 2024/0243221 A1 Jul. 18, 2024

(30) Foreign Application Priority Data
Jan. 13, 2023 (KR) .................. 10-2023-0005134

(51) Int. Cl.
*H10H 20/812* (2025.01)
*B60Q 1/22* (2006.01)
*B60Q 1/44* (2006.01)

(52) U.S. Cl.
CPC ............ *H10H 20/812* (2025.01); *B60Q 1/22* (2013.01); *B60Q 1/44* (2013.01); *B60Q 2400/20* (2013.01)

(58) Field of Classification Search
CPC ............ H10H 20/812; H10H 20/8512; H10H 20/0361; H10H 20/8514; H10H 20/882;
(Continued)

(56) References Cited

U.S. PATENT DOCUMENTS

2008/0238294 A1* 10/2008 Xu .................. C23C 18/1258
257/E31.038
2015/0292682 A1* 10/2015 Yang .................. F21V 19/004
362/382
(Continued)

FOREIGN PATENT DOCUMENTS

JP 6428106 B2 11/2018
JP 7460634 B2 4/2024
(Continued)

OTHER PUBLICATIONS

Sunghoon Kim et al., "Highly thin film with aerosol-deposited perovskite quantum dot/metal oxide composite for perfect color conversion and luminance enhancement", Chemical Engineering Journal, Dec. 2021, Netherlands.

*Primary Examiner* — Omeed Alizada
(74) *Attorney, Agent, or Firm* — Bridgeway IP Law Group, PLLC; Jihun Kim

(57) ABSTRACT

A light emitting device and a lamp for a vehicle including the same are described. A quantum dot thin film is formed on an LED device and is able to fully absorb light of the LED device and to prevent light leak phenomenon and color purity deterioration problems. Further, it is possible to form the quantum dot thin film of various designs depending on the shape of a light emitting module by depositing quantum dots in a thin thickness range with easy flexibility of luminance colors, without including a separate host matrix for forming the quantum dot thin film.

6 Claims, 11 Drawing Sheets
(7 of 11 Drawing Sheet(s) Filed in Color)

(58) Field of Classification Search
CPC ........ B60Q 1/22; B60Q 1/44; B60Q 2400/20; F21S 43/14; F21W 2103/25; F21W 2103/35; F21W 2103/40; F21W 2103/45; F21Y 2115/10
See application file for complete search history.

(56) References Cited

U.S. PATENT DOCUMENTS

2016/0013378 A1* 1/2016 Sakamoto ............ H10H 20/857
438/26
2021/0343964 A1* 11/2021 Chen ...................... H10K 50/11

FOREIGN PATENT DOCUMENTS

| KR | 10-2009-0059541 A | 6/2009 |
| KR | 10-2016-0132175 A | 11/2016 |
| KR | 10-2018-0018066 A | 2/2018 |

* cited by examiner

LIGHT EMITTING DEVICE AND VEHICLE LAMP INCLUDING THE SAME

CROSS-REFERENCE TO RELATED APPLICATIONS

This application claims the priority of Korean Patent Application No. 10-2023-0005134 filed on Jan. 13, 2023, in the Korean Intellectual Property Office, the disclosure of which is incorporated herein by reference.

BACKGROUND

1. Technical Field

The present disclosure relates to a light emitting device and a vehicle lamp including the same.

2. Related Art

In general, a rear combination lamp of a vehicle refers collectively to lamps mounted on rear parts of the vehicle, and is composed of a back lamp that turns on when a reverse gear is put, a brake lamp that turns on when a brake pedal is stepped on, and a direction indicator lamp.

Recently, the use of a rear combination lamp that uses a light emitting diode (LED) having a long lifespan and a high light efficiency as a light source is trended to be gradually increased, and a light source module of a rear combination lamp in the related art includes an LED light source, a PCB board for controlling a current supply to the LED light source, a reflection plate for reflecting light that comes out from the LED light source toward an outer lens, and a light diffusion lens installed in front of the reflection lens and configured to diffuse the light of the LED light source.

However, since the light source module in the related art as described above is configured so that the reflection plate is installed in front of the LED light source, the overall size of an optical system including the LED light source and the outer lens is increased, and this causes the disadvantages of a low degree of freedom of design, heavy weight, and increase of the manufacturing cost.

Since the light source module in the related art converts light emitted from the LED light source into a simple luminous image, such as a point, a line, or a surface, and radiates the converted luminous image, it has the disadvantage of low visibility, and in order to improve the visibility, the number of LED light sources should be increased, and this causes the manufacturing cost to be greatly increased.

There is a need for development of a vehicle lamp that can solve the above problems.

RELATED ART DOCUMENT

Patent Document (Patent Document 1) KR 10-2016-0132175 A1

SUMMARY

An object of the present disclosure is to provide a light emitting device and a lamp for a vehicle including the same.

Another object of the present disclosure is to provide a light emitting device in which a quantum dot thin film is formed on an LED device, the quantum dot thin film being able to fully absorb light of the LED device and to prevent the light leak phenomenon and color purity deterioration problems.

Still another object of the present disclosure is to provide a method for manufacturing a light emitting device, which can form a quantum dot thin film of various designs depending on the shape of a light emitting module by depositing quantum dots in a thin thickness range with easy flexibility of luminance colors, without including a separate host matrix for forming the quantum dot thin film.

In order to achieve the above objects, a light emitting device according to an embodiment of the present disclosure may include: a light emitting device; and a quantum dot thin film disposed on an upper part of the light emitting device, wherein the quantum dot thin film has a thickness equal to or larger than 0.5 μm.

The quantum dots may be selected from a group consisting of group 2-6 quantum dots, group 3-5 quantum dots, group 4-6 quantum dots, group 4 quantum dots, group 1-3-6 quantum dots, and a mixture thereof.

The light emitting device may be an LED device.

The quantum dot thin film may not include a host matrix, and may be formed by aerosolizing and depositing quantum dots or quantum dots embedded with scattered particles on the upper part of the light emitting device by high-speed spraying.

A lamp for a vehicle according to another embodiment of the present disclosure may include the above-described light emitting device.

The lamp for a vehicle may be a rear combination lamp.

A method for manufacturing a light emitting device according to still another embodiment of the present disclosure may include: forming a quantum dot thin film by depositing quantum dots or quantum dots embedded with scattered particles on an upper part of the light emitting device by an aerosol deposition method, wherein the quantum dot thin film has a thickness equal to or larger than 0.5 μm.

According to the present disclosure, the quantum dot thin film is formed on the LED device, and the quantum dot thin film is able to fully absorb the light of the LED device and to prevent the light leak phenomenon and color purity deterioration problems.

Further, it is possible to form the quantum dot thin film of various designs depending on the shape of the light emitting module by depositing the quantum dots in the thin thickness range with easy flexibility of the luminance colors, without including a separate host matrix for forming the quantum dot thin film.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
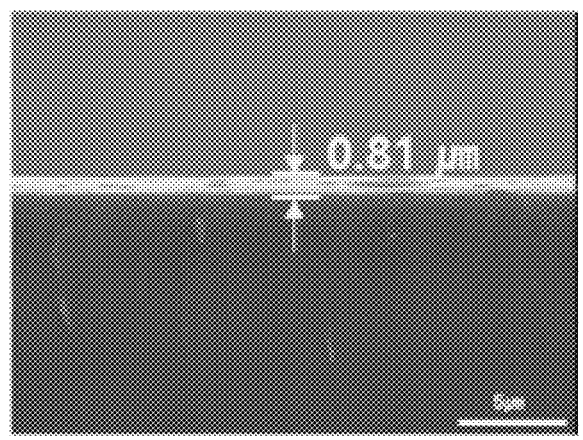
FIG. 1 is a SEM photo for a cross section of a quantum dot thin film according to an embodiment of the present disclosure.

Hereinafter, embodiments of the present disclosure will be described in detail so that those of ordinary skill in the art to which the present disclosure pertains can easily embody the same. However, the present disclosure can be implemented in various different forms, and is not limited to the embodiments described herein.

A quantum dot is a semiconductor nanocrystal or a semiconductor nanoparticle composed of a semiconductor material with a normal size of about 3 to 15 nm, and in particular, a particle that shows a quantum confinement effect is called a quantum dot. The quantum dot is a material having optical characteristics of high light efficiency and narrow full width half maximum (FWHM), and shows new physical optical characteristics having not been shown in the existing semiconductor bulk state.

Due to such new characteristics, the quantum dot, unlike the existing phosphor, absorbs wavelengths in a wide area band over a band gap, and thus may be used as an illuminant not only in a blue wavelength band but also in an ultraviolet area band. Further, since the quantum dot is composed of the same elemental compositions, and the size and the shape of the particle are controlled, it has the advantage of easily adjusting the luminescence of various wavelength bands.

The quantum dot is composed of a core/shell structure, and the core determines the optical characteristics and the shell serves as a protection layer for protecting the core, so that the core/shell structure exerts an influence on stability of the quantum dots, and is greatly affected by the luminous efficacy according to the interfacial characteristics of the core and the shell.

The quantum dot represents the optical characteristics in a recombination process of electrons and holes in an energy band gap. In this process, luminescence by exciting electrons through an incidence of light in a short wavelength band having high energy is called photo luminescence (PL).

By using such photo luminescence characteristics, the quantum dot can be applied to an optical film for display or a color filter using optical conversion (optical control)

In order to apply the quantum dot to the optical film or the color filter as described above, a host matrix is included to prevent the quantum dots from being condensed and to uniformly disperse the quantum dots.

The host matrix is of a transparent resin, and a hydrophobic material, such as silicone or acrylate, is generally used as the host matrix.

In case that the color filter is applied as described above, it is not possible to fully absorb (block) the light of an LED device, and problems may occur, in that the light leak phenomenon may occur and the color purity deteriorates.

In order to solve the above problems, it is required to increase the content of quantum dots in the color filter, but in this case, the cost for production of the color filter is increased. The increase of the content of the quantum dots causes the content of the host matrix for dispersing the quantum dots to be also increased, and thus the thickness of the manufactured color filter is also increased.

If the thickness of the color filter is increased as described above, a lamp including the light emitting device to which the color filter having the increased thickness is applied has the decreased degree of freedom in terms of shape deformation.

Accordingly, a light emitting device according to the present disclosure includes: a light emitting device; and a quantum dot thin film disposed on an upper part of the light emitting device, wherein the quantum dot thin film has a thickness equal to or larger than 0.5 µm.

The thickness of the quantum dot thin film may be equal to or larger than 0.5 µm, equal to or larger than 1 µm, equal to or larger than 2 µm, and preferably, equal to or larger than 2.5 µm. Further, the thickness of the quantum dot thin film may be in the range of 0.5 µm to 200 µm, 1 µm to 200 µm, 2 µm to 200 µm, and 2.5 µm to 200 µm.

The thickness of the quantum dot thin film is to block the light leak phenomenon and to limit the minimum thickness range in which full wavelength conversion is possible. Accordingly, in case of forming the quantum dot thin film having the minimum thickness equal to or larger than 2.5 µm as described above, it is possible to block the leak of the light by the light emitting device, and thus the full light absorption is possible, and the full wavelength conversion is possible.

To be described later, in case of aerosolizing and depositing only the quantum dots when forming the quantum dot thin film, the light is fully blocked in a state where the minimum thickness of the film is 4.7 µm and the full wavelength conversion is possible, whereas in case of aerosolizing and depositing the quantum dots embedded with oxidized particles, the light is fully blocked in a state where the minimum thickness of the film is equal to or larger than 2.5 μm or equal to or larger than 3 μm and the full wavelength conversion is possible.

As described above, the quantum dot thin film can be used in replacement of the existing color filter, and in this case, the color purity is excellent through excellent light blocking and full wavelength conversion within the minimum thickness range.

Further, the light emitting device of the present disclosure is a red light emitting device using the quantum dots, and to be described later, the quantum dot thin film is formed in a manner of being directly deposited on an upper part of the light emitting device without separately including the host matrix.

The quantum dots may be selected from a group consisting of group 2-6 quantum dots, group 3-5 quantum dots, group 4-6 quantum dots, group 4 quantum dots, group 1-3-6 quantum dots, and a mixture thereof.

The quantum dots may include group 2-6 quantum dots such as CdSe, CdS, CdTe, ZnSe, ZnS, and ZnTe, group 3-5 quantum dots such as InP and InAs, group 4-6 quantum dots such as PbS, PbSe, and PbTe, group 4 quantum dots such as Ge and Si, group 1-3-6 quantum dots such as $Cu_{1-x}In_xS_{1-y}Se_y$ ($0<x$ and $y<1$), or a mixture thereof, but the quantum dots are not necessarily limited to them.

The quantum dot may have a core-shell structure, and in this case, the core may be composed of the group 2-6 quantum dots, group 3-5 quantum dots, group 4-6 quantum dots, group 4 quantum dots, group 1-3-6 quantum dots, or the mixture thereof, and the shell may be a single shell, a double shell, or a triple shell.

Recently, since the concern for the environment is greatly increased and regulations on toxic substances are strengthened all over the world, eco-friendly cadmium-free quantum dots (InP/ZnS and InP/ZeSe/ZnS) may be used instead of the quantum dots having cadmium cores, and for example, when the eco-friendly cadmium-free quantum dots have the core-shell structure, the group 3-5 quantum dots can be used as the core, but the core is not necessarily limited thereto.

For example, the quantum dot may have a perovskite crystal structure.

For example, the quantum dot may be a metal halide type quantum dot having the perovskite crystal structure. In this case, the band gap of the quantum dot having the perovskite crystal structure can be adjusted by the metal halide element. The band gap energy of the quantum dot may be 1 eV to 5 eV.

For example, the metal halide type quantum dot having the perovskite crystal structure can be expressed as chemical formula 1 below, but the expression is not necessarily limited thereto.

$$ABX_3 \qquad \text{[Chemical formula 1]}$$

In the above chemical formula 1,

A represents organic cations or inorganic cations,

B represents metal cations, and

X represents halide anions.

For example, the chemical formula 1 may be expressed as $CsPbX'_3$ ($X'$ is Cl, Br, and/or I).

For example, the metal halide type quantum dot having the perovskite crystal structure may be a red quantum dot having an average particle size of 9 nm to 15 nm, and in this case, the red quantum dot may be expressed as $CsPb(BrI)_3$.

For example, the size of the metal halide type quantum dot having the perovskite crystal structure may be 1 mn to 900 nm. In case of forming the metal halide type quantum dot having the perovskite crystal structure with the size that exceeds 900 nm, there is a fundamental problem in that excitons are unable to go into light emission due to thermal ionization and delocalization of charge carriers in a large nanocrystal, but are separated into free charges and annihilated.

The above quantum dot thin film may not include the host matrix, and may be formed by aerosolizing and depositing the quantum dots or the quantum dots embedded with the scattered particles on the upper part of the light emitting device by high-speed spraying.

The scattered particles may include one or more selected from a group consisting of $Al_2O_3$, $SiO_2$, ZnO, $ZrO_2$, $BaTiO_3$, $TiO_2$, $Ta_2O_5$, $Ti_3O_3$, ITO, IZO, ATO, ZnO—Al, $Nb_2O_3$, SnO, MgO, and a combination thereof.

The light emitting device is an LED device, and in a preferred embodiment, it may be an LED surface-emitting backlight. However, the light emitting device is not limited to the above examples, and all LED light sources can be used without limits.

A lamp for a vehicle according to another embodiment of the present disclosure may include the light emitting device. The lamp for a vehicle may be a rear combination lamp, but it is not limited to the above example, and can be used for any lamp for a vehicle.

The "rear combination lamp (RCL)" collectively refers to lamps applied to the rear side of the vehicle. The vehicle location, stop state, start state, and lane change are indicated through light signals, such as lighting on and blinking of red, white, and yellow. The rear combination lamp is also called a "combination lamp".

It is general that the rear combination lamp includes a clearance lamp, a stop lamp, an indicator lamp, and a reverse lamp constituted as a whole. Various kinds of optical systems, such as light sources, lenses, and reflectors, are mounted on the bezel, and a separate controller controls the light signals in accordance with a vehicle driving state and a driver's intention. Fog lights may be added in accordance with the national standards or designs.

The mainstream light source of the rear combination lamp has been a halogen light source. Recently, the use of light emitting diode (LED) light source having a fuel efficiency more than five times higher than that of the halogen light source and a fast on/off operation has expanded. The lighting speed of the lamp is important for safety since even if the stop signal of the vehicle in front, which runs at a speed of 100 km/h, is only 0.1 second earlier, the safety distance of 27 m is secured.

The rear combination lamp is an indispensable element even for vehicle styling. However, the rear combination lamp in the related art uses various devices, such as a reflector, a light guide, a light curtain, and a texture pattern on a reflective surface, and in case of using the LED light source to which the color filter is applied, the shape change of the lamp is not easy. Accordingly, the present disclosure provides a light emitting device that does not need the color filter as described above, and in case of the rear combination lamp to which the light emitting device of the present disclosure is applied, it can be changed to various shapes on the point that the shape of the LED surface light emitting backlight can be freely changed, and thus rear combination lamp having the high degree of freedom of design can be developed.

That is, according to the light emitting device of the present disclosure as described above, the quantum dot thin film is formed by aerosolizing and depositing the quantum dots or the quantum dots embedded with the scattered particles on the upper part of the LED light source by the high-speed spraying. The quantum dot thin film can be formed as the thin film without being limited by the shape or the material of the light source.

The "flexibility" of the quantum dot thin film in the related art may mean whether the formed thin film itself is flexible, whereas the quantum dot thin film of the present disclosure is formed through deposition in accordance with the shape of the upper part of the light source, and thus the meaning of the flexibility is different from that in the related art.

That is, the quantum dot thin film of the present disclosure means to be deposited on the upper part of the light source in the form of a film, and even if various shapes of light sources exist, it is possible to form a dense film by depositing the quantum dots or the quantum dots embedded with the scattered particles on the upper part of the light source.

A method for manufacturing a light emitting device according to still another embodiment of the present disclosure may include forming a quantum dot thin film by depositing quantum dots or quantum dots embedded with scattered particles on an upper part of the light emitting device by an aerosol deposition method, wherein the quantum dot thin film has a thickness equal to or larger than 0.5 µm.

Since the light emitting device, the quantum dots, and the quantum dots embedded with the scattered particles are the same as those as described above, the detailed description thereof will be omitted.

The aerosolization may be conducted under vacuum conditions.

The quantum dot embedded with the scattered particle may be manufactured by mixing a precursor of the quantum dot with the scattered particle powder in a solvent, and then growing nanocrystals on the surface of the scattered particle powder, and crushing the grown nanocrystals. As another embodiment, the quantum dot may be manufactured by mixing the synthesized quantum dot with the scattered particle powder in the solvent, and then absorbing and binding the nanocrystals onto the surface of the scattered particle powder through evaporation of the solvent, and crushing the nanocrystals.

In this case, the precursor of the quantum dot or the scattered particle powder mixed with the quantum dot may have a size larger than the size of the quantum dot. For example, the scattered particle powder may have a size equal to or larger than about 300 nm and equal to or smaller than 2000 nm. Meanwhile, in mixing the quantum dot with the metalloid element oxide powder, about 0.5 to 20 parts by weight of the quantum dot may be mixed with 100 parts by weight of the scattered particle powder.

The process of aerosolizing and coating the quantum dot embedded with the scattered particle may be performed by using an aerosol deposition device.

The aerosol deposition device may include an aerosol chamber, a deposition vacuum chamber, a carrier gas supply means, a vacuum pump, and a nozzle. The aerosol chamber may accommodate the quantum dots and the scattered particle powder therein, and in the deposition chamber, an LED light source, for example, an LED surface luminescent backlight substrate, may be disposed. The carrier gas supply means may supply a carrier gas to the aerosol chamber, and the vacuum pump may make the deposition chamber in a vacuum state. The nozzle may be disposed to be spaced apart for a predetermined distance from the substrate, and may be connected to the aerosol chamber through a connection pipe. Meanwhile, the aerosol chamber may be provided with a vibrator so that the nozzle can spray the composite powder in a uniform aerosol form.

In the aerosol deposition process, if a carrier gas is injected into the aerosol chamber through the carrier gas supply means in a state where the quantum dots and/or the scattered particle powder are accommodated in the aerosol chamber and the LED light source is disposed in the deposition chamber, the quantum dots and/or the scattered particle powder are sprayed onto the LED light source through the nozzle in the aerosol form due to a difference in pressure between the deposition chamber in a vacuum state and the aerosol chamber, and thus a thin film composed of the quantum dots embedded with the scattered particles can be formed on the LED light source.

As the carrier gas in the aerosol deposition process, nitrogen ($N_2$) may be used. In case of using the nitrogen ($N_2$) as the carrier gas in the aerosol deposition process, the nitrogen does not form the discharge plasma, and thus the problem of damaging the quantum dots and/or the scattered particle powder can be solved.

In the aerosol deposition process, since the applied powder particles having a size of about 1 µm are sprayed at high speed, the deterioration phenomenon may be caused due to various factors, such as a carrier gas type, a particle shape, a carrier gas flow rate condition, and a nozzle design. However, since the quantum dots used in the present disclosure have a very small size (1 nm to 15 nm) and the kinetic energy thereof is not high enough to cause damage, no deterioration phenomenon can be found, and rather, by forming a fairly dense membrane by using the high-speed spraying method, pinholes and defects inside the membrane can be resolved, and the membrane thickness can be greatly reduced.

Meanwhile, the aerosol gas flow rate of the quantum dots embedded with the aerosolized scattered particles according to an embodiment of the present disclosure can be controlled to 0.1 L/min to 10 L/min, 0.1 L/min to 1.0 L/min, 0.1 L/min to 0.5 L/min, and 0.2 L/min to 0.4 L/min. In case of controlling the aerosol flow rate as described above, the amount of impact being applied to the quantum dots and/or the scattered particle powder can be sufficiently reduced so as not to lower the light emission intensity, and the mechanical characteristics or the optical characteristics of the thin film being manufactured may not deteriorate. In particular, by controlling the aerosol gas flow rate as described above, the luminance characteristics among the optical characteristics can be greatly improved. Further, by adjusting the gas flow rate during the aerosolizing as described above, a very thin line width can be implemented, and thus there is an advantage that the pattern process with no mask becomes possible.

Manufacturing Example 1

Manufacturing of a Light Emitting Device on which a Quantum Dot Thin Film (RQD Layer) Including Quantum Dots is Formed The chamber was almost in a vacuum state by using a mechanical rotary pump, and CdSeS/CdS/ZnS alloy core/shell red quantum dots were dispersed into heptane with a concentration of 24 mg per 100 ml, and then disposed in the aerosol chamber. The deposition of the quantum dots started by creating aerosolized droplets of the red QD(RQD) solution by using an ultrasonic nebulizer (1.8 MHz) and $N_2$ transport gas injected at a speed of 1 L/min. The created RQD aerosol quickly passed through an orifice nozzle (diameter of 1 mm) due to a difference in pressure between the aerosol and the deposition chamber under the carrier gas flow. The aerosol was quickly sprayed onto a blue LED substrate that is apart for 5 mm from the nozzle. Further, a substrate holder attached to the blue LED substrate was set to automatically move along an XY plane at a scan speed of 5 mm/s. As a result, the RQD was deposited in a dense state on the blue LED substrate to form an RQD layer.

Manufacturing Example 2

Manufacturing of a Light Emitting Device on which a Quantum Dot Thin Film Including Quantum Dots Embedded with Scattered Particles is Formed In case of a system including a mixture of RQD and $SiO_2$, two constituent elements converged to nozzles in each aerosol chamber for a subsequent collective deposition. In order to control the supply amount of the RQD and $SiO_2$, the aerosol gas flow rate was controlled to 0.3 L/min by using $N_2$ transport gas through adjustment of a mass flow controller, and the RQD aerosol created by ultrasonic waves passed quickly through an orifice nozzle (diameter of 1 mm) due to a difference in pressure between the aerosol and the deposition chamber under the carrier gas flow. The aerosol was quickly sprayed onto a blue LED substrate that is apart for 5 mm from the nozzle. Further, a substrate holder attached to the blue LED substrate was set to automatically move along an XY plane at a scan speed of 5 mm/s. As a result, the RQD-$SiO_2$ was deposited in a dense state on the blue LED substrate to form a RQD-$SiO_2$ layer.

Experiment Example 1

Result of Analyzing a SEM Cross-Sectional Image and EDS Elements According to the Deposition Thickness The membrane thickness of the RQD layer formed in the above manufacturing example 1 was changed by adjusting the RQD concentration and the number of scans. The thickness of the RQD layer was set to 0.81 μm, 2.0 μm, 3.8 μm, and 4.7 μm, and EDS element analysis was performed after the SEM photo for the cross section was measured.

The experiment results are as in FIGS. 1 to 8.

Figure 2:
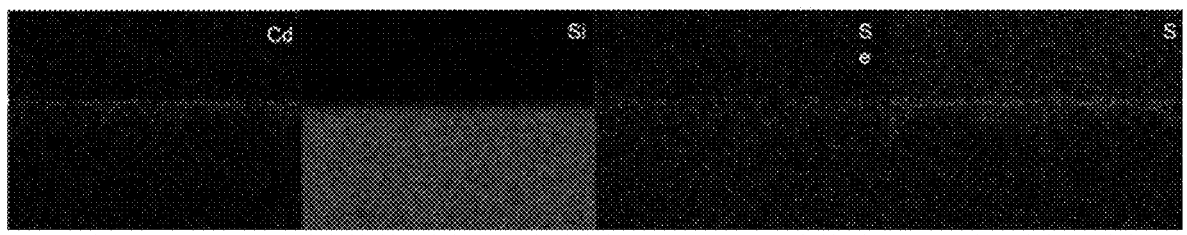
FIG. 2 shows the result of an EDS element analysis for a quantum dot thin film according to an embodiment of the present disclosure.
Figure 3:
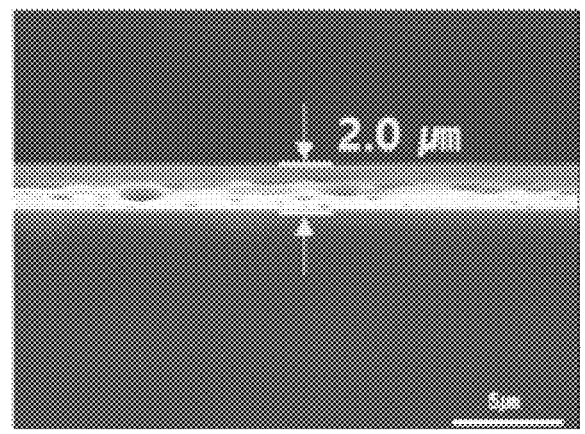
FIG. 3 is a SEM photo for a cross section of a quantum dot thin film according to an embodiment of the present disclosure.
Figure 4:
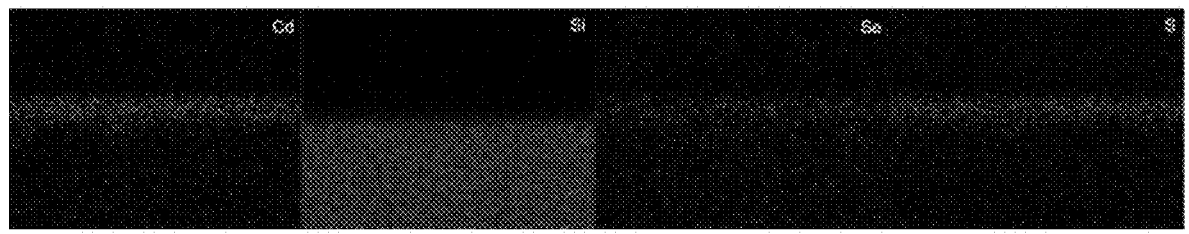
FIG. 4 shows the result of an EDS element analysis for a quantum dot thin film according to an embodiment of the present disclosure.
Figure 5:
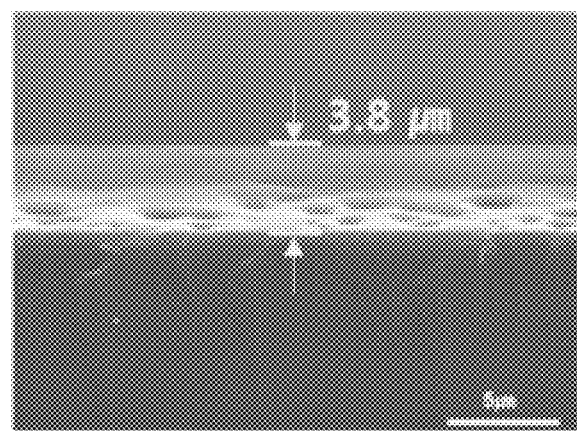
FIG. 5 is a SEM photo for a cross section of a quantum dot thin film according to an embodiment of the present disclosure.
Figure 6:
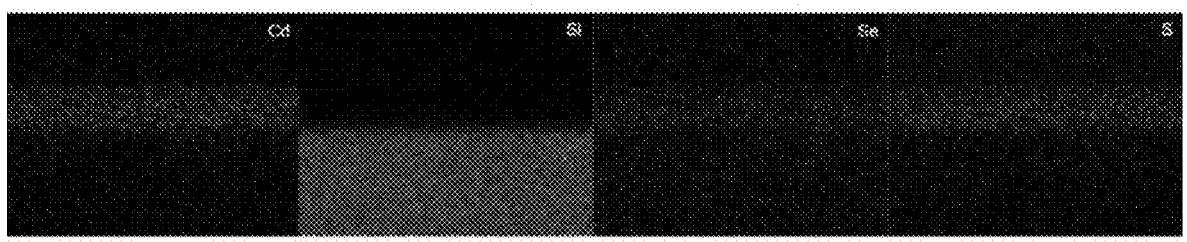
FIG. 6 shows the result of an EDS element analysis for a quantum dot thin film according to an embodiment of the present disclosure.
Figure 7:
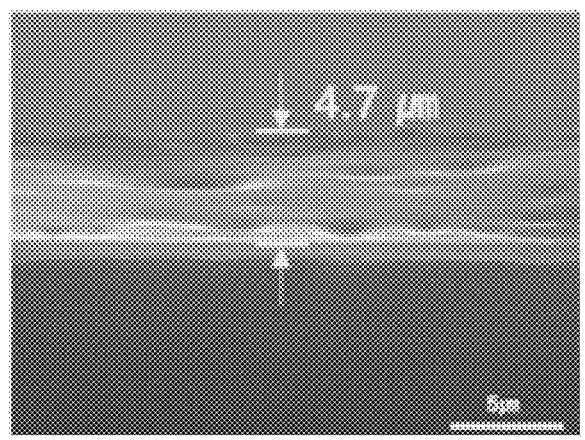
FIG. 7 is a SEM photo for a cross section of a quantum dot thin film according to an embodiment of the present disclosure.
Figure 8:
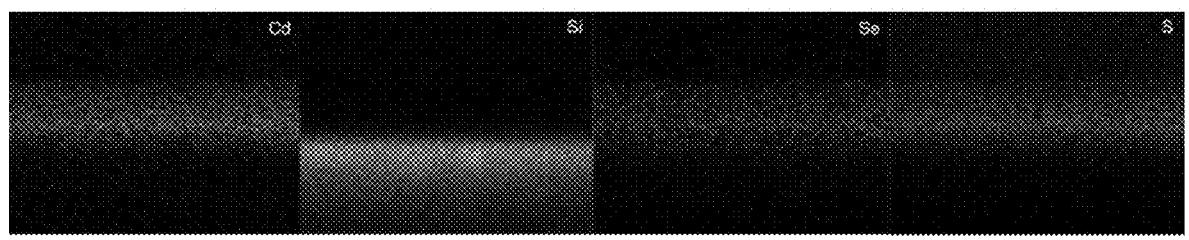
FIG. 8 shows the result of an EDS element analysis for a quantum dot thin film according to an embodiment of the present disclosure.

FIG. 1 shows a cross section of an RQD layer having a thickness of 0.81 μm, and FIG. 2 shows the result of an EDS element analysis. FIG. 3 shows a cross section of an RQD layer having a thickness of 2.0 μm, and FIG. 4 shows the result of an EDS element analysis. FIG. 5 shows a cross section of an RQD layer having a thickness of 3.8 μm, and FIG. 6 shows the result of an EDS element analysis. FIG. 7 shows a cross section of an RQD layer having a thickness of 4.7 μm, and FIG. 8 shows the result of an EDS element analysis.

According to the above experiment results, it can be identified that the RQD layer was uniformly deposited, and all elements of the quantum dots were deposited.

Experiment Example 2

The Result of Optical Performance Evaluation

Optical performance evaluation for a blue LED substrate on which the RQD layer of the above experiment example 1 was performed. Specifically, in order to analyze the fluorescence characteristics by down-conversion, the excitation and light emission spectrum was measured by using a fluorescence spectrophotometer (SHIMADZU, RF-5301PC) having a xenon lamp as a light source.

Figure 9:
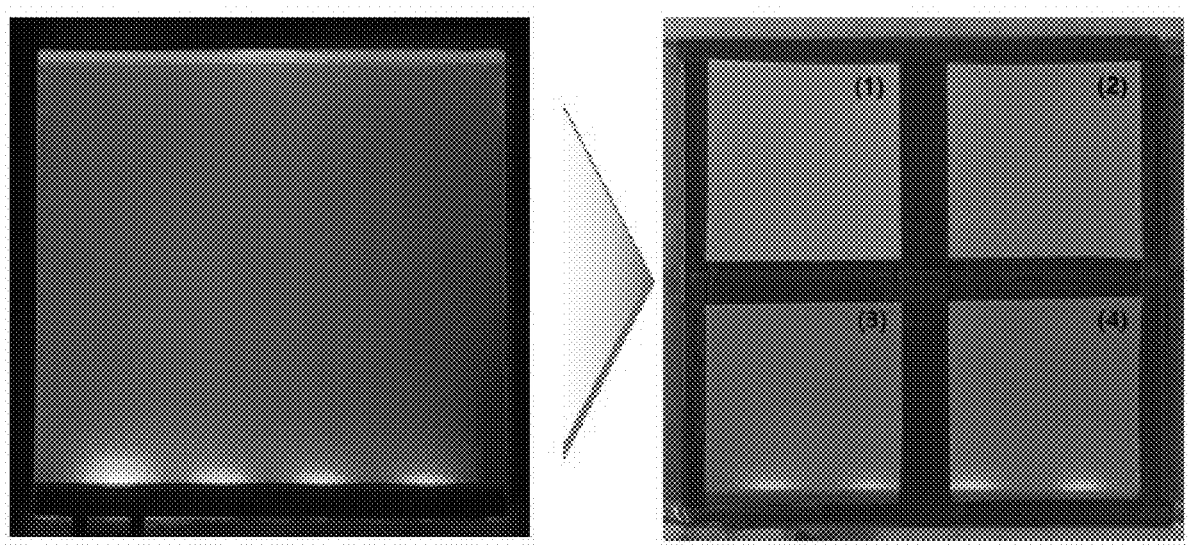
FIG. 9 shows the result of a blue light leak phenomenon for an LED device according to an embodiment of the present disclosure.
Figure 10:
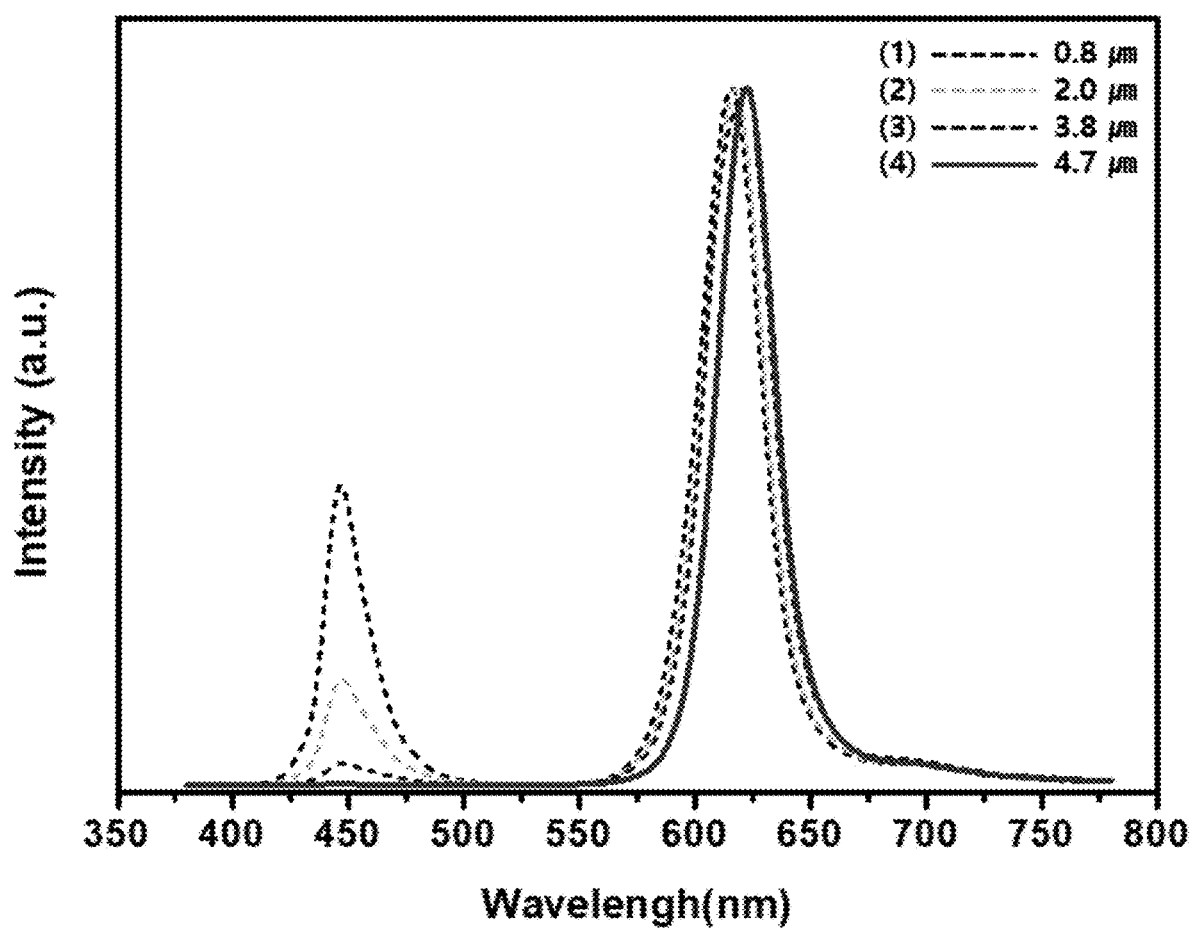
FIG. 10 shows the result of a luminous spectrum measurement of an LED device on which a quantum dot thin film is formed according to an embodiment of the present disclosure.

The experiment results are as in FIGS. 9 and 10.

FIG. 9 shows identification whether the blue light leak phenomenon appears by the naked eye. If the thickness is 0.8 μm, it was identified by the naked eye that the blue light was not completely blocked, whereas otherwise, there was no significant difference by the naked eye.

However, according to the result of identifying the light emission spectrum by analyzing the fluorescence characteristics by the down-conversion in FIG. 10, in case of the thickness less than 4.7 μm, the blue light was identified on the point that the peak appears in the wavelength of 450 nm.

As a result, it was identified that the complete blue light blocking was possible only in case of having the thickness equal to or larger than 4.7 μm.

Experiment Example 3

Color Coordinate Change and Light Efficiency Evaluation

In order to identify whether the blue light was completely blocked, the color coordinate change was identified. The LED device was manufactured as in manufacturing example 1, and it was identified whether the same blue light blocking effect was obtained even with respect to high power blue LED of the class of 2.3 W as the blue LED device.

A method for obtaining the color coordinates was performed by KS A 0061. Further, in order to evaluate the light efficiency, the power consumption, the speed of light, and the light efficiency were measured.

Figure 11:
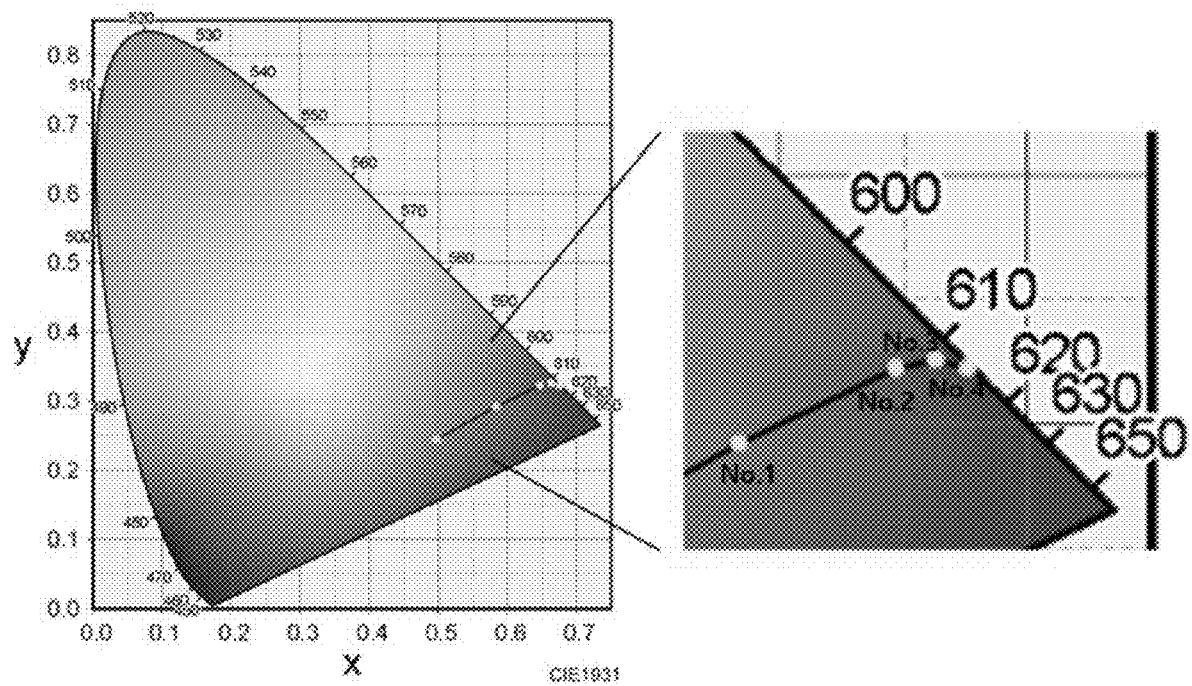
FIG. 11 shows the result of a color coordinate analysis of an LED device on which a quantum dot thin film is formed according to an embodiment of the present disclosure.

The experiment result is as shown as in FIG. 11 and Table 1.

TABLE 1

|  | No. 1 | No. 2 | No. 3 | No. 4 |
|---|---|---|---|---|
| Power consumption (W) | 2.31 (35 mA/66 V) | 2.31 (35 mA/66 V) | 2.31 (35 mA/66 V) | 2.31 (35 mA/66 V) |
| Cx | 0.5813 | 0.6465 | 0.6629 | 0.6753 |
| Cy | 0.2908 | 0.3227 | 0.3255 | 0.3222 |
| Speed of light (lm) | 78.668 | 77.787 | 71.569 | 61.082 |
| Light efficiency (lm/W) | 34.055 | 33.674 | 30.982 | 26.442 |

As described above, No. 1 represents that the thickness of the thin film is 0.8 μm, No. 2 represents that the thickness of the thin film is 2.0 μm, No. 3 represents that the thickness of the thin film is 3.8 μm, and No. 4 represents that the thickness of the thin film is 4.7 μm.

Figure 12:
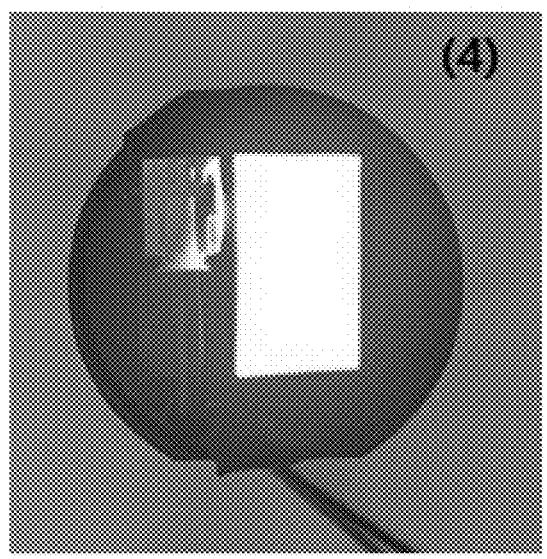
FIG. 12 is a photo of an LED device on which a quantum dot thin film is formed according to an embodiment of the present disclosure.

According to the above experiment results, in case of the film thickness of 4.7 μm, the complete blue light blocking effect was shown (refer to FIG. 12), and color coordinates (Cx: 0.6753, Cy: 0.3222) of the high purity red color was presented. In this case, the light efficiency was at the level of 26.41 m/W.

Figure 13:
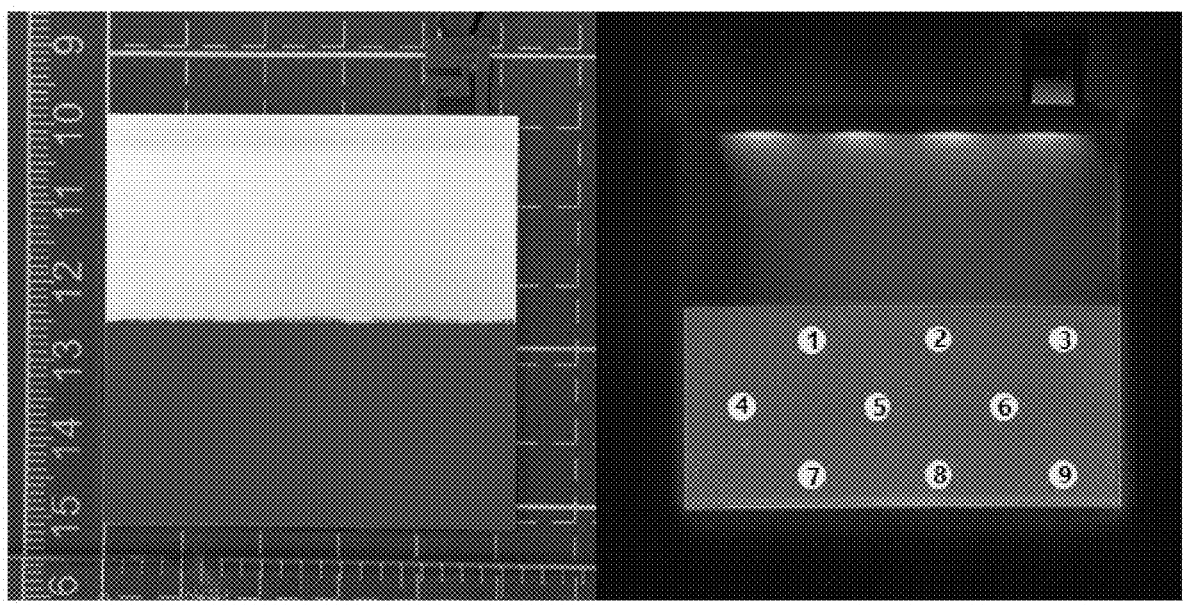
FIG. 13 shows the result of a color coordinate identification of an LED device on which a quantum dot thin film is formed according to an embodiment of the present disclosure.
Figure 14:
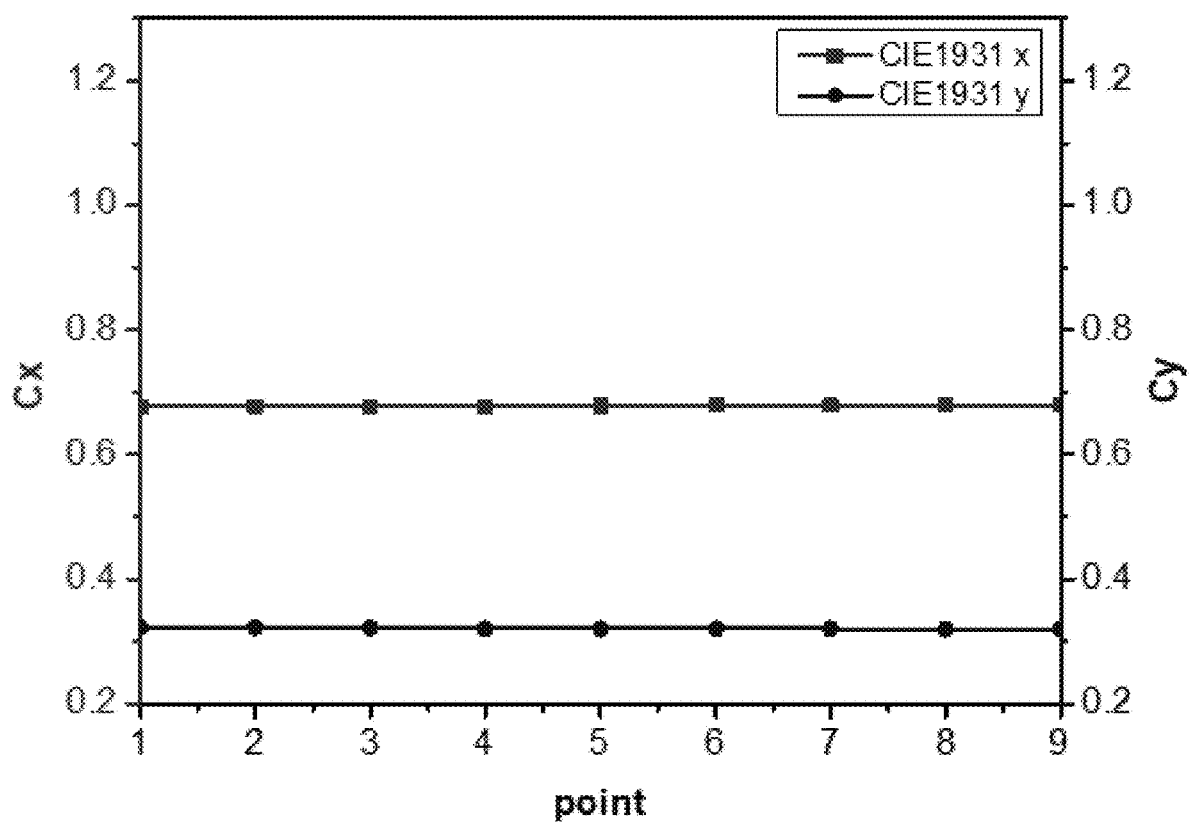
FIG. 14 shows the result of a color coordinate change rate of an LED device on which a quantum dot thin film is formed according to an embodiment of the present disclosure.

The evaluation result of the color coordinate uniformity with respect to No. 4 is as shown as in FIG. 13, FIG. 14, and Table 2.

FIG. 13 shows that the color coordinates were identified at specific points (① to ②) after the thin film was formed, and FIG. 14 shows that the color coordinate change rate after the thin film was formed on a part of a blue LED substrate.

TABLE 2

| No. | CIE1931 x | CIE1931 y |
|-----|-----------|-----------|
| 1 | 0.677 | 0.322 |
| 2 | 0.677 | 0.322 |
| 3 | 0.677 | 0.321 |
| 4 | 0.678 | 0.320 |
| 5 | 0.678 | 0.320 |
| 6 | 0.679 | 0.320 |
| 7 | 0.679 | 0.320 |
| 8 | 0.680 | 0.319 |
| 9 | 0.680 | 0.319 |

According to the above experiment results, Cx (min) is 0.677, Cy (min) is 0.319, Cx (max) is 0.680, Cy (max) is 0.322, $\Delta$Cx is 0.003, and $\Delta$cy is 0.003.

The above experiment results mean that the color coordinate change rate is very small, and in case of forming the thin film by the above manufacturing example, the deposition thickness becomes very uniform, and uniform luminous color will be shown with respect to the entire deposition surface.

Experiment Example 4

SEM Cross-Sectional Image for a Quantum Dot Thin Film Including Quantum Dots Embedded with Scattered Particles and the Result of Light Performance Evaluation The SEM cross section was measured with respect to a quantum dot thin film including quantum dots embedded with scattered particles manufactured in the manufacturing example 2.

Figure 15:
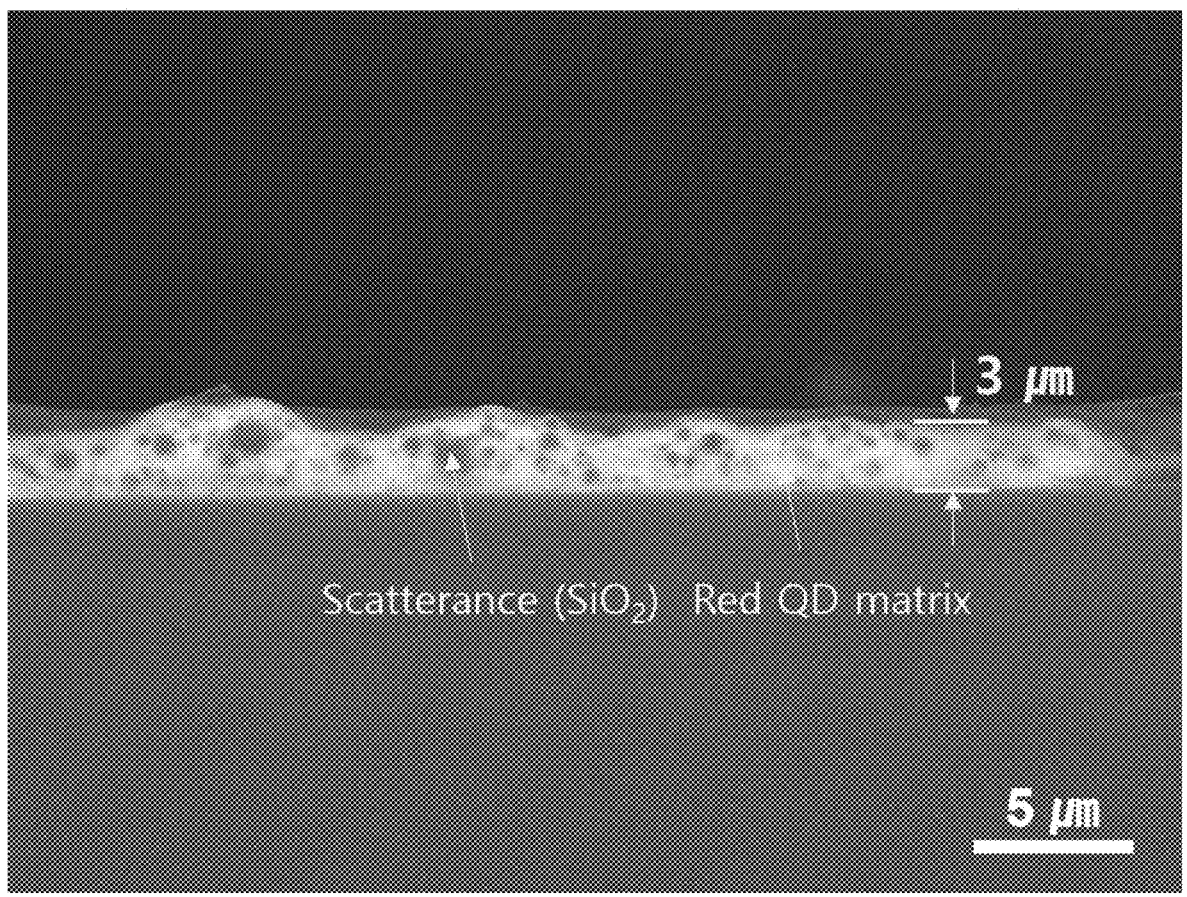
FIG. 15 is a photo of a SEM cross section for a quantum dot thin film including quantum dots embedded with scattered particles according to an embodiment of the present disclosure.

Referring to FIG. 15, it can be identified that the scattered particles and the quantum dots are uniformly distributed, and the thickness thereof is 3 μm.

Figure 16:
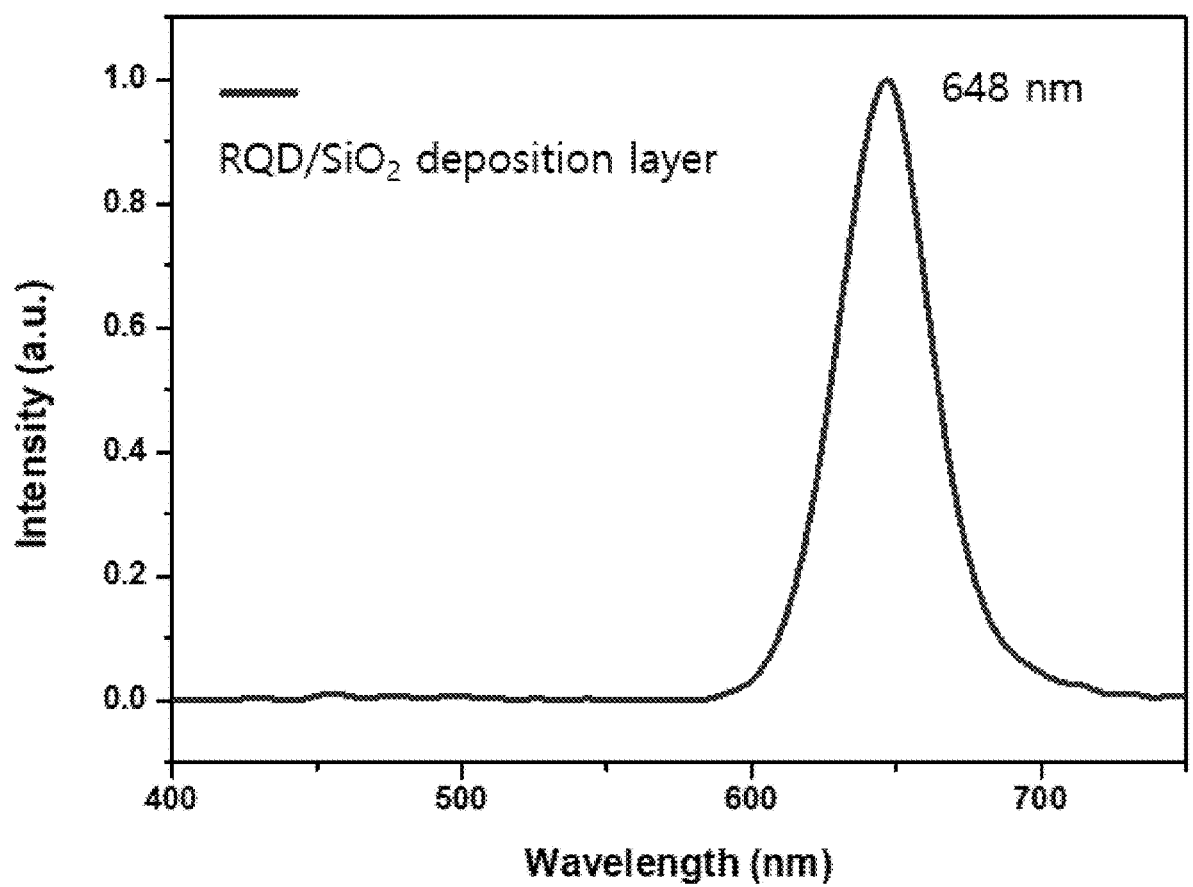
FIG. 16 shows the result of a luminous spectrum measurement of an LED device on which a quantum dot thin film including quantum dots embedded with scattered particles is formed according to an embodiment of the present disclosure.

With respect to the quantum dot thin film having a thickness of 3 μm, the result of analyzing the fluorescence characteristics by down-conversion is as in FIG. 16.

Referring to FIG. 16, it was identified that the peak did not appear in the wavelength of 450 nm, and the blue light was completely blocked.

As compared with the previous experiment example 2, in case of a quantum dot thin film including quantum dots embedded with scattered particles, it was identified that the thickness of the thin film on which the complete wavelength conversion was possible differed depending on whether the scattered particles were included on the point that the complete blue light blocking appeared even in case that the thickness was lowered to 3 μm.

Although the preferred embodiments of the present disclosure have been described in detail, the scope of the present disclosure is not limited thereto, and various modifications and improvements performed by a person skilled in the art through the use of the basic concept of the present disclosure being defined in the appended claims also belong to the scope of the present disclosure.

What is claimed is:

1. A light emitting device comprising:
    a light emitting device; and
    a quantum dot thin film disposed on an upper part of the light emitting device, wherein the quantum dot thin film has a thickness of 2.5 μm or more,
    wherein the quantum dot thin film does not include a host matrix,
    wherein the quantum dot thin film is embedded with scattered particles.

2. The light emitting device of claim 1, wherein quantum dots in the quantum dot thin film are selected from a group consisting of group 2-6 quantum dots, group 3-5 quantum dots, group 4-6 quantum dots, group 4 quantum dots, group 1-3-6 quantum dots, and a mixture thereof.

3. The light emitting device of claim 1, wherein the light emitting device is an LED device.

4. A lamp for a vehicle comprising the light emitting device according to claim 1.

5. The lamp according to claim 4, wherein the lamp for a vehicle is a rear combination lamp.

6. A method for manufacturing a light emitting device comprising:
    forming a quantum dot thin film by depositing quantum dots or quantum dots embedded with scattered particles on an upper part of the light emitting device by an aerosol deposition method,
    wherein the quantum dot thin film has a thickness in a range of 2.5 μm to 200 μm,
    wherein the quantum dot thin film does not include a host matrix.

* * * * *